United States Patent [19]

Emo et al.

[11] 4,232,262
[45] Nov. 4, 1980

[54] CONNECTOR CONTACT TERMINAL CONTAMINATION PROBE

[76] Inventors: George C. Emo, 743 Jonsol Ct., Gahanna, Ohio 43230; Thomas G. Grau, 24 Dogwood Dr., Mendam Township, Morris Township, N.J. 07960

[21] Appl. No.: 950,724

[22] Filed: Oct. 12, 1978

[51] Int. Cl.³ .................... G01R 31/04; G01R 27/02; G01R 1/067
[52] U.S. Cl. .................... 324/65 P; 324/51; 324/64; 324/158 P; 324/158 F
[58] Field of Search .................... 324/51, 72.5, 73 R, 324/73 AT, 73 PC, 158 F, 158 P, 28 CR, 64, 65 R, 65 P, 66, 62

[56] References Cited

U.S. PATENT DOCUMENTS

| | | | |
|---|---|---|---|
| 3,265,968 | 8/1966 | Bilodeau et al. | 324/66 |
| 3,335,365 | 8/1967 | Libhart | 324/64 |
| 3,493,858 | 2/1970 | Baron et al. | 324/158 P |
| 3,617,876 | 11/1971 | Robinson | 324/51 |
| 3,714,572 | 1/1973 | Ham et al. | 324/158 P X |
| 3,735,254 | 5/1973 | Severin | 324/64 |
| 3,974,443 | 8/1976 | Thomas | 324/64 |
| 3,996,514 | 12/1976 | Brown et al. | 324/62 |
| 3,996,516 | 12/1976 | Luther | 324/158 F |
| 4,063,172 | 12/1977 | Faure et al. | 324/158 P |
| 4,092,593 | 5/1978 | Wolk | 324/158 F |

OTHER PUBLICATIONS

Thorsdale, W. A., *Simultaneous Continuity and Short Testing*, IBM Tech. Discl. Bull. vol. 1, No. 8, Jan. 1968, pp. 1195, 1196.
Pivnichny, et al., *Connector Solder Joint Flaw Detection* . . . , IBM Tech. Discl. Bull., vol. 16, No. 3, Aug. 1973, pp. 764, 765.
Arnhart, et al., *Miniature Kelvin Probe*, IBM Tech. Discl. Bull., vol. 19, No. 12, May 1977, pp. 4679, 4680.

Primary Examiner—Gerard R. Strecker
Attorney, Agent, or Firm—Dwight A. Marshall

[57] ABSTRACT

Apparatus for testing connectors to detect the presence of contamination films and foreign material on the contact terminals of a connector. The testing apparatus comprises electrode apparatus (2) for use in engaging the contact terminals (701) of a connector (700) and support apparatus (3) intended to receive a connector and hold the connector in a fixed relationship to the electrode apparatus. The testing apparatus further comprises guide apparatus (4) for supporting electrodes (221) of the electrode apparatus and positioning apparatus (5) for enabling the guide apparatus to align the electrodes with the connector contact terminals and for enabling the electrode apparatus to engage the aligned electrodes with the connector contact terminal. Coupling apparatus (6) comprises a controller (60) arranged to selectively couple the engaged electrodes with electrical resistance measuring circuitry (100) to measure the resistance of a contamination film and foreign material appearing on the connector contact terminals.

18 Claims, 5 Drawing Figures

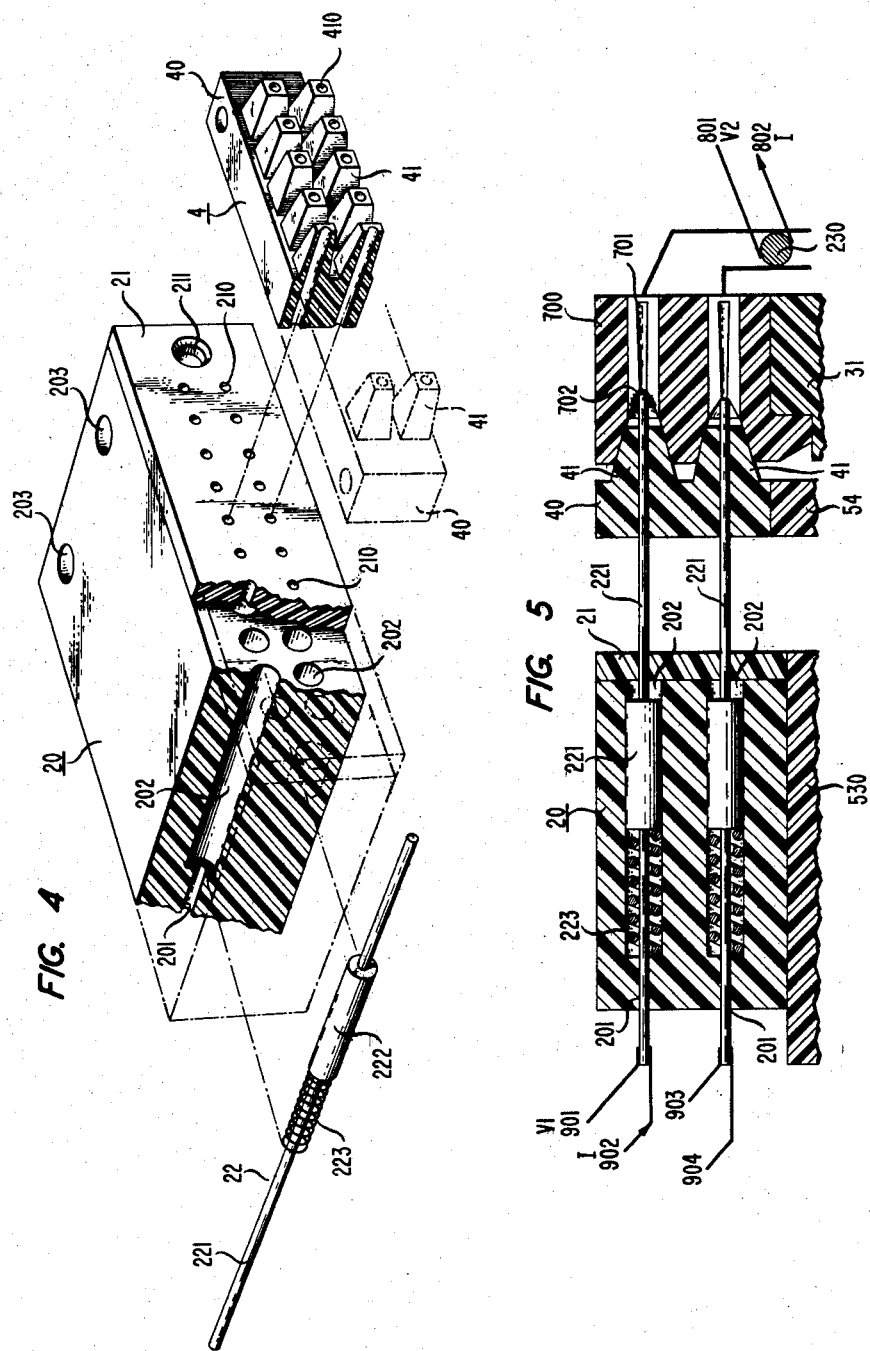

CONNECTOR CONTACT TERMINAL CONTAMINATION PROBE

TECHNICAL FIELD

This invention relates to apparatus for use in detecting connector contact terminal contamination. In particular, it relates to apparatus for use in detecting and measuring contamination films and foreign material occurring on the contact terminals of a connector.

BACKGROUND ART

Multicontact connectors have been widely used by the electrical and communication industry to interconnect circuit paths of component electrical circuits to form a larger composite electrical circuit. When component circuits are interconnected by connectors the composite circuit may fail to operate either from a failure of one of the component circuits or from a poor connection between connector contact terminals used to interconnect the paths of the circuits. The latter type of circuit failure quite often results from a poor connection or no connection at all between mating connector contact terminals. This type of connector failure may arise either because some particular matter or film formation has appeared on the contact terminal surfaces of the connectors so that the contact terminals may fail to make electrical connection with one and another.

Often times during the manufacture of connectors a contamination film inadvertently appears on ones of the contact terminals of connectors. Subsequently, the connectors are installed in and on electrical equipment to provide a means to interconnect component circuits that may be installed after the electrical equipment has been shipped and located on customer premises. When the component circuits are later installed, the contamination film results in a poor electrical connection between mating connector contact terminals that cause failure of the composite circuit. Locating these types of circuit failures is extremely difficult.

Measurement techniques and apparatus as evidenced by U.S. Pat. Nos. 3,735,254 and 3,974,443 have been developed to measure the electrical resistance of conducting surfaces. These measurement techniques, sometimes referred to as a so-called four-point contact resistance measurement, are accomplished by applying a known constant current to two outer points of a conducting surface area and measuring the voltage between two inner points of the same surface area. The electrical resistance of the conducting surface may then be readily ascertained from the known current and measured voltage. A problem with the apparatus used to make a four-point contact resistance measurement is that sufficient space must be available in order to gain access to the measurement points.

Apparatus has been disclosed by U.S. Pat. No. 3,996,514 for use with connectors to measure the resistance between printed circuit patterns on a circuit board and the connector contact terminals. The prior art connector measuring apparatus comprises a first pair of probes for engaging a conductor finger on the circuit board and a second pair of probes for engaging the contact terminal of the connector. Measurement of the resistance between the connector contact terminal and the circuit board conductor finger is made by applying a known constant current between one of the first and second probes and determining the voltage between the other ones of the first and second probes. A problem with this type of apparatus is that it is not intended for use in measuring contamination of a connector contact terminal and two pairs of probes are required to measure the contact resistance between a connector contact terminal and a circuit board conductor. A further problem occurs in that the apparatus as intended for use with circuit board edge connectors and is too bulky and cumbersome for use in measuring and detecting contamination on a contact terminal of a male pin insertion type of connector.

Accordingly, a need exists in the art for apparatus arranged for use in detecting and measuring contamination of a connector contact terminal. A need also exists for connector testing apparatus arranged for use in detecting and measuring contamination films and foreign material that inadvertently occur on contact terminals during manufacture of a pin insertion type of connector.

SUMMARY OF THE INVENTION

The foregoing problem is solved and a technical advance is achieved by the provision of connector testing apparatus arranged to couple electrical resistance measuring circuitry to the contact terminals of a connector to detect and measure contamination of the connector contact terminals. The testing apparatus comprises electrode apparatus having electrodes for engaging the connector contact terminals and support apparatus for receiving a connector and holding the connector in a fixed relationship with respect to the electrode apparatus. Guide apparatus is provided for supporting the electrodes and positioning apparatus is provided to enable the guide apparatus to align the electrodes with respect to the connector contact terminals and to enable the electrode apparatus to engage the aligned electrodes with the connector contact terminals. The testing apparatus also comprises coupling apparatus for sequentially coupling the electrodes with electrical resistance measuring circuitry to measure the resistance of contamination films and foreign material appearing on ones of the connector contact terminals.

In accordance with the invention, apparatus for testing connectors comprises electrode apparatus having a plurality of electrode assemblies each having a first electrode, a sleeve member affixed to the first electrode and a compliant member for biasing the first electrode in engagement with a connector contact terminal. The electrode apparatus also comprises a probe assembly housing having a plurality of first bores each sized to slidably receive a first electrode and a plurality of a second bores each axially aligned with a first bore and each sized to slidably receive the electrode compliant and sleeve members that are retained by a retaining member within the second bores of the probe assembly housing. The electrode apparatus further comprises a second electrode and insulator apparatus arranged to hold and support the second electrode in engagement with the tail sections of the connector contact terminals.

Also in accordance with the invention, apparatus for testing connectors comprises a block assembly arranged to receive and hold a connector. The connector testing apparatus also comprises a guide support member having a plurality of head members each formed to fit individually into pin receiving apertures of the connector and each having an axial bore therein sized to slidably receive an electrode and align the electrode with a contact terminal of the connector.

Also in accordance with the invention, apparatus for testing a connector includes positioning apparatus comprising guide rod apparatus supported at one end by a support block and at the other end by a block assembly arranged to receive and hold a connector. Carriage apparatus supporting a probe assembly provided with a plurality of electrodes is slidably mounted on the guide rod apparatus and is attached by a pair of spring biased pin members extending from one end thereof to carriage plate apparatus also slidably mounted on the guide rod apparatus and which is arranged to support a guide support member for use in aligning the electrodes with contact terminals of the connector. The positioning apparatus further comprises operating apparatus for enabling movement of the carriage apparatus and the carriage plate apparatus along the guide rod apparatus to engage each of the guide support head members with the connector pin receiving apertures and to extend the electrodes through the axial bores of the head members into engagement with the connector contact terminals.

Also in accordance with the invention, apparatus for testing connectors comprises coupling apparatus for selectively connecting electrodes engaged with connector contact terminals to electrical resistance measuring circuitry. The coupling apparatus comprises a controller for selecting electrodes and switch apparatus controlled by the controller to sequentially couple a current supply and a voltage measuring device to ones of the controller selected electrodes engaged with the connector contact terminals to determine the electrical resistance of contamination films and foreign material appearing on the connector contact terminals between ones of the electrodes.

In further accordance with the invention, a method of testing current terminals of a connector with test apparatus having apparatus for mounting electrodes, support apparatus, tapered head members for slidably supporting and aligning first ones of the electrodes, positioning apparatus, and electrical resistance measuring apparatus, comprises a step of receiving and positioning a connector in the support apparatus to engage a tail section of the connector contact terminals with a second one of the electrodes. The method of testing the connector also comprises a step of operating the positioning apparatus to engage the tapered head members with corresponding connector pin receiving apertures and then positioning the mounting apparatus to extend the first electrodes through the tapered head members to engage the connector contact terminals. The method further comprises the step of selectively coupling the electrical resistance measuring apparatus to ones of the first and second electrodes engaged with the connector contact terminals to detect and measure the resistance of contamination films and foreign material appearing on a connector contact terminal.

DESCRIPTION OF THE DRAWING

The foregoing, as well as other objects, features and advantages of the invention, will be more apparent from a description of the drawing:

FIG. 4 is a fragmentary sectional prospective view illustrating assembly of the electrode probe and guide assemblies of the instant connector testing apparatus; and FIG. 5 is a fragmentary and sectional side view illustrating the use of the electrode probe and guide assemblies in aligning and engaging electrodes with contact terminals of a connector.

DESCRIPTION OF THE INVENTION

1. Apparatus Description

Figure 1:
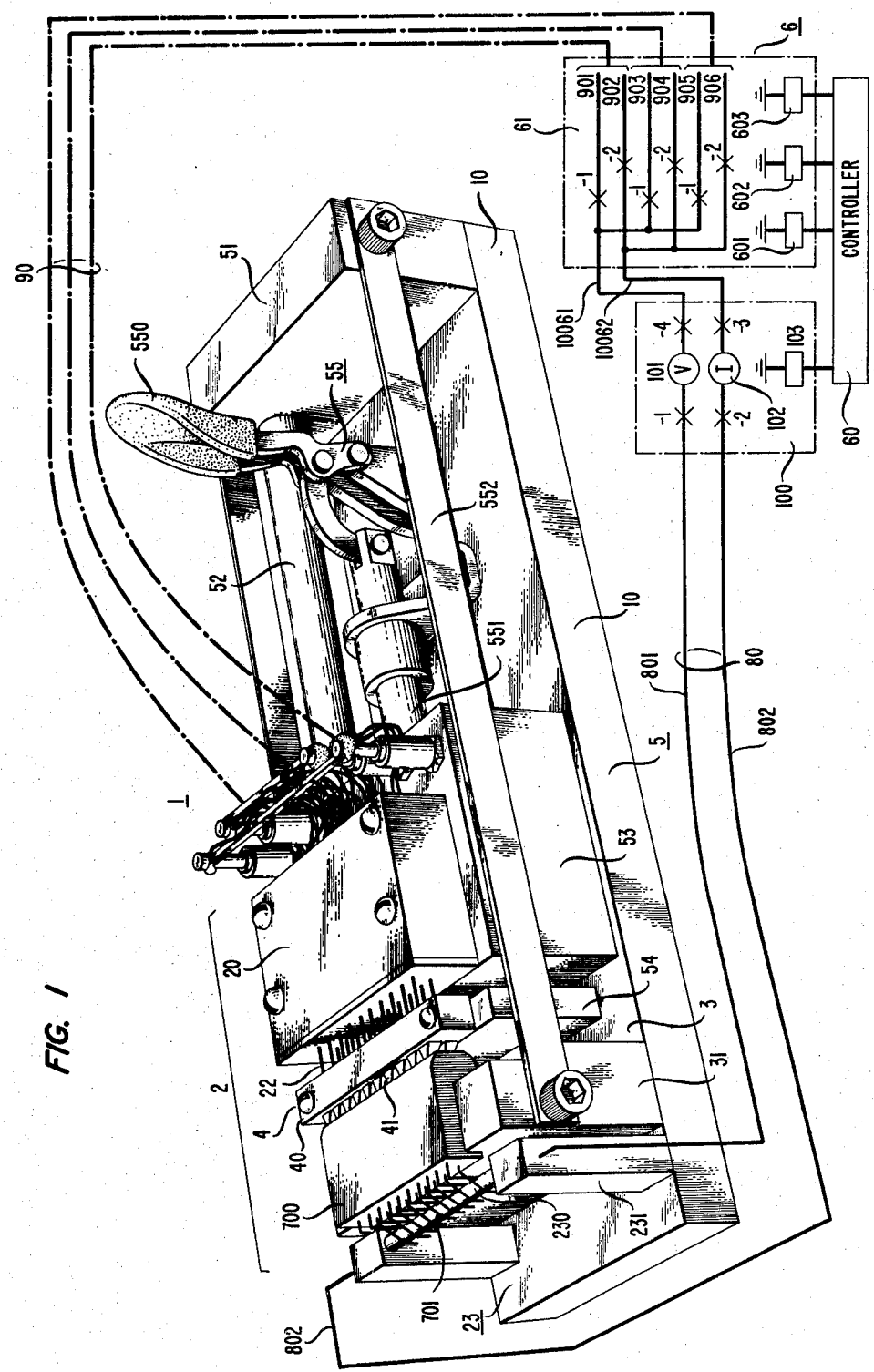
FIG. 1 is a prospective view showing exemplary connector testing apparatus embodying the principles of the instant invention.

Referring to the drawing, and more specifically to FIG. 1 of the drawing, connector testing apparatus 1 set forth therein is intended for use in the manufacture and repair of connector apparatus to test for contamination of the connector contact terminals. During the manufacturing process a connector 700 is received by connector testing apparatus 1 and tested by selectively coupling electrical resistance measuring circuitry 100 to ones of the connector contact terminals 701 in order to detect and measure electrical resistance of contamination films and foreign material that may inadvertently appear on a contact terminal.

Connector testing apparatus 1 comprises a base member 10 having support apparatus 3 located thereon that is arranged to receive and hold a connector 700 in a fixed relationship with regard to electrode apparatus 2. Support apparatus 3, FIG. 3 of the drawing, comprises a block assembly 31 constructed with a recess 310 having side walls 311 and a stepped section 312 that are intended for use in slidably receiving a connector 700 and aligning the connector contact terminals 701 with electrode apparatus 2. Block assembly 31 may also be formed with registration pins in the well-known manner that can be located and positioned on block assembly 31 so as to be able to receive and hold connector 700 in a fixed relationship to electrode apparatus 2.

Figure 2:
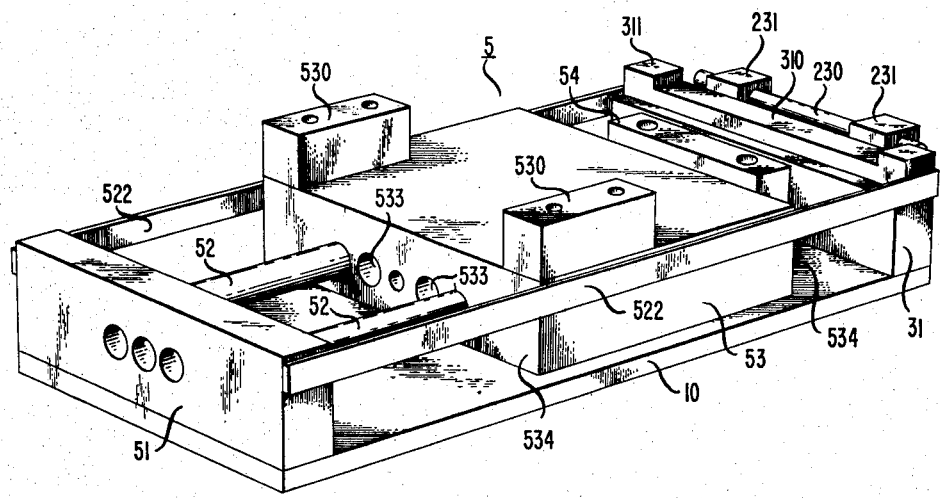
FIG. 2 is a prospective view illustrating partial assembly of the connector testing apparatus for use in positioning electrodes into engagement with the contact terminals of a connector.

Referring to FIG. 2 of the drawing, base member 10, in addition to having block assembly 31 located on one end thereof, has end support block 51 located on the other end. Each support block 51 is constructed to hold one end of guide rod apparatus 52 that is affixed to and extends outwardly from block assembly 31. In the embodiment of the invention, guide rod apparatus 52 is assumed to be a pair of parallel guide rods 52 each supported at one end by block assembly 31 and at the other end by end support block 51 to lie in a plane parallel to base member 10. Guide rods 52 slidably support both carriage apparatus 53 and carriage plate apparatus 54 which are used respectively, FIG. 1 of the drawing, to mount and carry an electrode probe assembly housing 20 and an electrode guide support member 40.

Figure 3:
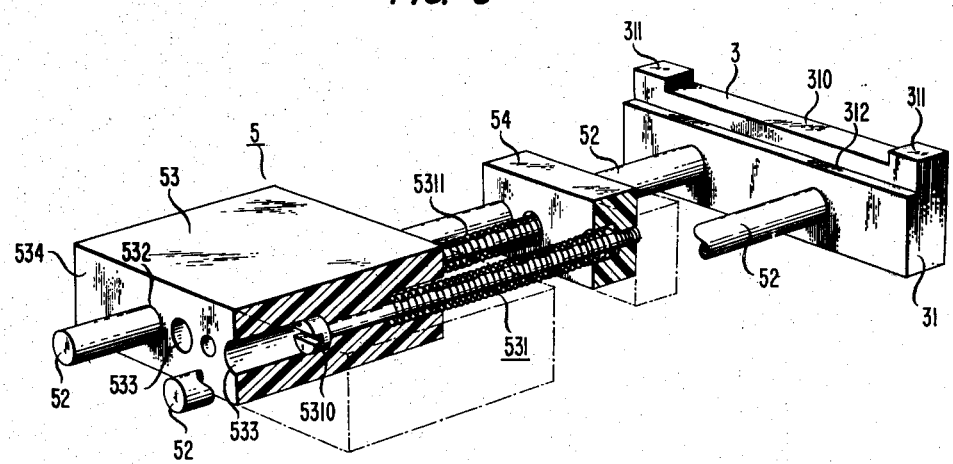
FIG. 3 is a fragmentary sectional prospective view illustrating construction of the electrode positioning apparatus.

As set forth in FIG. 3 of the drawing, carriage plate apparatus 54 comprises a plate member slidably mounted on guide rods 52 and which is affixed to a pair of spring biased pin members 531 extending from carriage apparatus 53. Carriage apparatus 53 is a generally rectangular shaped block member having first bores 532 drilled therein parallel to the top and bottom surfaces and which are each sized to slidably receive a guide rod 52 so that the carriage apparatus 53 may be moved and positioned along guide rods 52.

Carriage apparatus 53 also includes a pair of spring biased pin members 531 each comprised of a bolt member 5310 and compliant spring member 5311. In addition, carriage apparatus 53 has a pair of second bores 533 that are drilled through the block parallel to first bores 532 and which are counterbored from each end surface 534 of the block to a diameter sized to slidably receive respectively the head of bolt member 5310 and spring member 5311.

In assembly, carriage plate apparatus 54 and carriage apparatus 53 are slidably mounted on guide rods 52 so that carriage plate apparatus 54 is positioned between block assembly 31 and carriage apparatus 53. Bolt members 5310 are inserted into second bores 533 of one end surface 534 so that the shank portion thereof extend through the counterbore sections located at the other end surface 534 of carriage apparatus 53 toward carriage plate apparatus 54. Spring members 5311 are placed over the shank portion of a bolt member 5310 and partially inserted into a counterbore section of a second bore 533. Bolt members 5310 are then secured to carriage plate apparatus 54 such that carriage plate apparatus 54 is positioned and spring biased with respect to carriage apparatus 53.

As set forth in FIG. 1 of the drawing, connector testing apparatus 1 also includes operating apparatus 55, such as handle device 550 pivotally mounted on base member 10, that is coupled by rod and support apparatus 551 to carriage apparatus 53. Operation of handle device 550 enables rod and support apparatus 551 to move both carriage apparatus 53 and carriage plate apparatus 54 along guide rods 5. Guide supports 552 attached to block assembly 31 and end support block 51 may also be provided to furnish support for block assembly 31 and end support 51 and to further guide movement of carriage apparatus 53 along guide rails 52. Although a handle 550 suitable for manual operation is illustrated in the drawing, it is to be understood that other apparatus, for example a geared or hydraulic member operated in accordance with movement of a production or assembly line, could be used to enable rod and support apparatus 551 to move and position carriage apparatus 53 and carriage plate apparatus 54 along guide rails 52.

Carriage apparatus 53 and carriage plate apparatus 54 are used respectively to carry probe housing 20 and guide support member 40 in order that electrode assemblies 22 may be positioned with respect to connector contact terminals 701 and guided into contact therewith. Referring to FIG. 4 of the drawing, an electrode assembly 22 comprises an electrode 221 that may either be a 0.02 inch (0.051 cm) diameter gold or gold plated copper rod approximately 1.8 inch (4.57 cm) in length. A stainless steel or similar type of sleeve 222 having a diameter of 0.06 inch (0.15 cm) is affixed to electrode 221 and a highly compliant spring member 223 is slidably fitted over one end of electrode 221 into position against an end of sleeve 222.

Probe housing 20 is provided for use in mounting a plurality of electrode assemblies 22 in a row and column configuration corresponding to the contact terminals of a connector. Connector 700, sometimes referred to as a pin insertion type of connector, may be a single or twin contact terminal connector, or may have a plurality of contact terminals 701 mounted therein in either a single or multirow and column configuration. The embodiment of the invention assumes that a multirow and column type of connector 700 is to be tested for contact terminal contamination. Thus, probe housing 20 is a generally rectangular block of insulating material having a plurality of first bores 201 drilled therein in a row and column configuration parallel to the top and bottom surfaces of probe housing 20 and each sized to slidably receive an electrode 221. Each first bore 201 is counterbored to form a second bore 202 that is axially aligned with a first bore 201 and which is sized to receive both the electrode sleeve 222 and spring member 223.

In assembly, a spring member 223 is fitted over an electrode 221 and the combined electrode 221, sleeve 222, and spring member 223, forming an electrode assembly 22 is positioned within probe housing 20 so that both sleeve 222 and spring member 223 are slidably located in second bore 202 and the rear portion of electrode 221 is slidably located in first bore 201. When all of the electrode assemblies 22 have been mounted within probe housing 20, a retaining member 21 having a plurality of holes 210 in a similar row and column configuration and each sized to slidably receive an electrode 221 is fitted over the ends of each of the electrodes 221 and affixed to probe housing 20 by means of screws 221. Each electrode assembly 22 is thereby retained within probe housing 20 and is biased by spring member 223 to normally maintain a front portion of electrode 221 fully extended beyond the front surface of retaining member 21. The assembled probe housing 20 is mounted by screws 203 either directly, FIG. 2 of the drawing, or by means of mounting blocks 530 onto carriage apparatus 53 and located so that the extended front portions of electrodes 211 are positioned toward carriage plate apparatus 54 and block assembly 31.

Referring to FIG. 4 of the drawing, connector testing apparatus 1 also comprises a guide support member 40 used to support electrodes 221 and align each electrode 221 into engagement with a connector contact terminal. Guide support member 40 is a rectangular shaped block constructed of insulating material and having a flat rear surface. The front surface of guide support member 40 is constructed to have a plurality of head members 41 each formed and positioned on the front surface of guide support member 40 to fit individually into a pin receiving aperture of a connector. Each head member 41 has an axial bore 410 drilled therein that is sized to slidably receive an electrode 221. In assembly the plurality of electrodes 221 extending from probe housing 20 are each inserted from the rear surface of guide support member 40 into one of the head members axial bore 410. Guide support member 40 is then moved along the electrodes 221 of electrode assemblies 22 and fastened with screws to carriage plate apparatus 54, FIG. 1, so that the ends of the electrodes 221 are normally retracted within head members 41 and each head member 41 is aligned with respect to a male pin receiving aperture of a connector 700.

Electrode apparatus 2, used for connecting electrical resistance measuring circuitry 100 with connector contact terminals 701, also comprises a second electrode 230 that is supported on base member 10 by insulator apparatus 231. Insulator apparatus 231 is constructed of insulating material and is intended for use in holding and supporting the solder plated copper rod electrode 230 to engage the tail sections of connector contact terminals 701.

Each of the electrode assemblies 22 and electrode 230 is connected respectively by a conductor pair, such as conductor pairs 901, 902 and 801, 802 of cables 90 and 80, to coupling apparatus 6 that is arranged to selectively couple electrode apparatus 2 with electrical resistance measuring circuitry 100. In the embodiment of the invention coupling apparatus 6 includes switch apparatus 61 which is assumed to be a relay type scanner wherein the sequential operation of relays such as relays 601, 602, and 603 closes their respective contacts to couple a conductor pair, for example, conductors 901 and 902, associated with an electrode assembly 22 to electrical resistance measuring circuitry 100. Although relay switching type of scanner apparatus is disclosed, it is to be understood that other types of scanner apparatus well known in the art may be used to connect the electrode conductors with electrical resistance measuring circuitry 100. For example, a crossbar switch or electronic apparatus, both of which are well known in the art, may be used for this purpose.

Switch apparatus 61 is coupled by two conductors 10061 and 10062 to electrical resistance measuring circuitry 100 comprising a constant current source 102, voltage measuring device 101, and relay apparatus 103 intended for use in connecting voltage measuring device 101 to conductors 801, 10061 and constant current source 102 to conductors 802, 10062.

Coupling apparatus 6 also comprises a controller 60 used for selecting a contact terminal and for controlling the sequence of testing each contact terminal 701 of connector 700. Controller 60 may be one of a general class of well-known stored program processors or wired logic type of controller both of which are well known in the art and each of which is capable of operating switch apparatus 61 to sequentially scan each electrode assembly 22 and to selectively couple electrodes 221 and 230 with voltage measuring device 101 and constant current source 102. In addition to controlling both switch apparatus 61 and electrical resistance measuring circuitry 100, controller 60 may also include an arithmetic logic unit wherein the numerical value of voltage recorded by voltage measuring device 101 may be arithmetically divided in the well-known manner by the value of current generated by constant current source 102 to determine a value of resistance which may be displayed, printed, or used to indicate rejection when the value of measured resistance of a connector contact terminal exceeds a predetermined value.

2. Apparatus Operation

Referring to FIG. 1 of the drawing, it is assumed that handle device 550 had been operated to move both carriage apparatus 53 and carriage plate apparatus 54 along guide rod apparatus 52 toward end support block 51 into a disengaged position. In the disengaged position, probe housing 20 is positioned with respect to guide support member 40 such that the ends of the electrodes 221 of electrode assemblies 22 are retracted within the axial bores 410 of head members 41. In initiating the test sequence a connector 700 is moved and guided into position in block assembly 31 in order that the pin receiving apertures of connector 700 are aligned with respect to the corresponding guide support head members 41 and the tail sections of the connector contact terminal 701 are aligned and engaged with electrode 230. Handle device 550 is then operated to position probe housing 20 and guide support member 40 to align and engage each of the electrode assemblies 22 with a connector contact terminal 701.

The operation of handle device 550 causes carriage apparatus 53 and carriage plate apparatus 54, FIG. 3 of the drawing, to move along guide rods 52 toward held connector 700 and block assembly 31. Guide support member 40 attached to carriage plate assembly 54, FIG. 5, is carried along with carriage plate assembly 54 so that the plurality of head members 41 become engaged with and are inserted into the pin receiving apertures of connector 700. Guide support member 40 continues to move until the head members 41 are fully engaged and meshed with the connector receiving apertures such that the axial centerline of the axial bore 410 of each head member 41 is in alignment with the axial centerline of a corresponding connector contact terminal 701.

Carriage plate apparatus 54 stops its movement, FIG. 3 of the drawing, along guide rails 52 when guide support members 41 have been meshed with the connector receiving apertures. However, carriage apparatus 53 continues to move along guide rails 52 and carry probe housing 20, FIG. 5, so that the ends of electrodes 221, normally retracted within guide support head members 41, are extended beyond the ends thereof into engagement with connector contact terminals 701. When the engaging movement of carriage apparatus 53 and probe assembly housing 20 has ended, the compliant spring member 223 of each electrode assembly 22 biases electrode 221 into engagement with a connector contact terminal 701.

After connector 700 has been secured to block assembly 31 and electrode assemblies 22 positioned to engage connector contact terminals 701, controller 60, FIG. 1, selectively operates switch apparatus relay 601 and relay 103 to selectively couple electrical resistance measuring circuitry 100 with electrode 230 and a first electrode assembly 22. Current then flows over a path from constant current source 102 through operated relay contacts 103-3 over conductor 10062, through operated switch apparatus relay contacts 601-2 and over conductor 902 to the first electrode assembly 22. The current flow continues along a path, FIG. 5, over electrode 221, through any contamination film or foreign material 702, connector contact terminal 701 and the tail portion thereof to electrode 230 to conductor 802 of cable 80, FIG. 1, through operated relay contact 103-2 to constant current source 102.

In addition, controller 60 selectively couples voltage measuring device 101 to the first electrode assembly 22 over a path extending through operated relay contacts 103-4, over conductor 10061, through operated relay contacts 601-1 through conductor 901 of cable 90 and to electrode 230 over a path extending through operated relay contacts 103-1 and conductor 801 of cable 80. Since a known and constant value of current flows from conductors 902, FIG. 5, through electrode 221 and connector contact terminal 701 and electrode 230 to conductor 802, the value of the resultant voltage drop appearing across the conductors 901 and 801 and measured by voltage measuring device 101 is determinative of the electrical resistance of connector contact terminal 701. A contamination film or foreign material 702 inadvertently appearing on connector contact terminal 701 increases the resistance offered to the flow of current and therefore causes a larger voltage drop to occur between the conductors 901 and 801. The resulting larger voltage drop measured by measuring voltage device 101 indicates the presence of a contamination film or foreign material that may be present on a connector contact terminal 701 and which may, if not corrected or removed, cause connector 700 to fail when placed in service.

In the embodiment of the invention, constant current source 102, FIG. 1, is assumed to generate a constant value of current. However, the relationship between voltage, current, and resistance is well established and it is possible that different values of generated current and the resulting measured voltages could be transmitted to controller 60 wherein well-known mathematical logic circuitry could be provided to obtain the connector contact terminal resistance by dividing measured voltages by values of generated current.

When electrical resistance measuring apparatus 100 has measured the resistance of a first connector contact terminal 701, controller 60 releases switch apparatus relay 601 and operates relay 602. Operation of switch apparatus relay 602 couples another electrode assembly 22 to constant current supply 102 and voltage measuring device 101 in order that the resistance of another connector contact terminal 701 can be measured. Controller 60 sequentially operates relays of switch apparatus 61, such as relays 601, 602 and 603, until each contact terminal 701 of connector 700 has been measured. If the test indicates the presence of a contamination film or foreign material on a contact terminal 701, connector 700 may be repaired before shipping. When the test sequence indicates that the measured resistance of each contact terminal 701 is less than a predetermined value of resistance, the tested connector 700 is considered to have passed the test and is removed from testing apparatus 1 in order that other connectors may be similarly tested.

After completion of the testing sequence, FIG. 1, handle device 550 is operated to initiate the disengagement of electrode assemblies 22 with the connector contact terminals 701. Operation of handle device 550 moves carriage apparatus 53 along guide rails 52 to thereby enable the attached probe assembly housing 20, FIG. 5, to disengage electrodes 221 from connector contact terminals 701 and retract them within guide support head members 41. As set forth in FIG. 3 of the drawing, further movement of carriage housing 53 along guide rails 52 relieves the biasing tension on carriage plate apparatus 54 so that the coupling bolts 5310 subsequently enable carriage plate apparatus 54 to move back along guide rails 52 thereby moving guide support member 40 to disengage head members 41 from the pin receiving apertures of connector 700. Connector 700 may then be removed from block assembly 31 and connector testing apparatus 1 is again ready to test another connector.

SUMMARY

It is obvious from the foregoing that the facility, economy, and efficiency of testing connectors may be substantially enhanced by testing apparatus arranged to test the contact terminals of a connector. It is further obvious from the foregoing that connector testing apparatus having an electrode corresponding to each connector contact terminal and which is arranged to simultaneously enage each connector contact terminal with a pair of electrodes that is selectively connected to electrical measuring circuitry arranged to measure the electrical resistance of the connector contact terminal facilitates the manufacturing and testing of connectors to detect connector contact contamination.

While the connector testing apparatus of the instant invention has been disclosed with a common electrode utilized to engage the tail sections of the connector contact terminal and with a plurality of electrodes utilized to engage each connector contact terminal, it is to be understood that such an embodiment is intended to be illustrative of the principles of the invention and that numerous other arrangements may be devised by those skilled in the art without departing from the spirit and the scope of the invention.

For example, the connector contact contamination probe disclosed in a copending application, Ser. No. 950,723, could be used with the instant connector testing apparatus to measure the contamination of the connector contact terminals. A plurality of connector contact contamination probes mounted in the probe housing of the instant connector testing apparatus could be used to engage a pair of electrodes with each connector contact terminal. The instant switch apparatus could be used to selectively couple the pair of folded electrodes of the probes to electrical resistance measuring circuitry to detect and measure contamination of connector contact terminals.

What is claimed is:

1. Apparatus for testing connectors, said apparatus having
   circuitry (100) for measuring electrical resistance; and
   testing apparatus (1) for coupling said measuring circuitry to contact terminals (701) of a connector (700)
   CHARACTERIZED IN THAT
   said testing apparatus comprises
   electrode apparatus (2, 4) having electrodes (221, 230) for engaging the connector contact terminals, said electrode apparatus having a probe assembly (20) for mounting ones of said electrodes and a guide support member (40) for slidably supporting said mounting electrodes;
   support apparatus (3) for receiving a connector and holding the connector in a fixed relationship with said electrode apparatus;
   positioning apparatus (5) for enabling said guide support member to align said one electrodes with the connector contact terminals and said probe assembly to extend said aligned electrodes through said guide support member to engage said aligned electrodes with the connector contact terminals; and
   coupling apparatus (6) for selectively coupling said engaged electrodes with the measuring circuitry to measure the resistance of contamination films and foreign material appearing on the connector contact terminals.

2. The connector testing apparatus set forth in claim 1
   CHARACTERIZED IN THAT
   said electrode apparatus comprises
   a plurality of electrode assemblies (22), each of said electrode assemblies having
   a first electrode (221);
   a sleeve member (222) affixed to said first electrode; and
   a compliant member (223) for biasing said first electrode in engagement with one of the connector contact terminals.

3. The connector testing apparatus set forth in claim 2
   CHARACTERIZED IN THAT
   said electrode apparatus comprises
   a probe assembly housing (20) for mounting said electrode assemblies, said probe assembly housing having a plurality of first bores (201) each sized to slidably receive said first electrode and a plurality of second bores (202) each axially aligned with one of said first bores and each sized to slidably receive said electrode compliant and sleeve members; and a retaining member (21) formed for slidably receiving said first electrode and retaining said electrode compliant and sleeve members within said probe assembly housing second bores.

4. The connector testing apparatus set forth in claim 3

CHARACTERIZED IN THAT
said electrode apparatus comprises
a second electrode (230); and
insulator apparatus (231) for holding and supporting said second electrode to engage a tail section of each of the connector contact terminals.

5. The connector testing apparatus set forth in claim 4

CHARACTERIZED IN THAT
said support apparatus comprises
a block assembly (31) arranged for receiving a connector and for aligning each conductor contact terminal with respect to said first and second electrodes.

6. The connector testing apparatus set forth in claim 5

CHARACTERIZED IN THAT
said electrode apparatus comprises
a guide support member (40) having a plurality of head members (41) for aligning said first electrodes with the connector contact terminals, each of said head members formed to fit individually into pin receiving apertures of the connector and each having an axial bore (410) therein sized to slidably receive one of said first electrodes.

7. The connector testing apparatus set forth in claim 6

CHARACTERIZED IN THAT
said positioning apparatus comprises
an end support block (51);
rod apparatus (52) supported at one end by said support block and at the other end by said block assembly;
carriage apparatus (53) for supporting said probe assembly, said carriage apparatus slidably mounted on said rod apparatus and having a pair of spring biased pin members (531) extending from one end thereof; and
carriage plate apparatus (54) for supporting said guide support member, said carriage plate apparatus affixed to said spring biased pin members and slidably mounted on said rod apparatus.

8. The connector testing apparatus set forth in claim 7

CHARACTERIZED IN THAT
said positioning apparatus further comprises
operating apparatus (55) for enabling movement of said carriage apparatus and said carriage plate apparatus along said rod apparatus to engage each of said guide support head members with the connector pin receiving apertures and extend said first electrodes through said head members to engage the connector contact terminals.

9. The connector testing apparatus set forth in claim 8 in which
said measuring circuitry comprises a voltage measuring device (101) and a current supply (102)
CHARACTERIZED IN THAT
said coupling apparatus comprises
a controller (60); and
switch apparatus (61) controlled by said controller for selectively coupling each of said first electrodes and said second electrode with said voltage measuring device and said current supply.

10. Apparatus for testing connectors, said apparatus having
circuitry (100) for measuring electrical resistance, and
testing apparatus (1) for coupling said measuring circuitry to contact terminals (701) of a connector (700)
CHARACTERIZED IN THAT
said testing apparatus comprises
a probe assembly (2) having an electrode (221) corresponding to each connector contact terminal,
electrode apparatus (230,231) for terminating a tail section of the connector contact terminals,
support apparatus (3) for receiving a connector and holding the connector in a fixed relationship with respect to said probe assembly and said electrode apparatus,
guide apparatus (4) having a head member (41) for slidably supporting said electrode and formed to fit into pin contact receiving apertures of the connector,
positioning apparatus (5) for enabling said guide apparatus to insert said head member into a pin contact aperture and for enabling said probe assembly to extend said electrode through said head member to engage a connector contact terminal, and
coupling apparatus (6) for selectively coupling said electrode apparatus and said electrode with said measuring apparatus to measure the resistance of contamination films and foreign material appearing on the engaged connector contact terminal.

11. The connector testing apparatus set forth in claim 10

CHARACTERIZED IN THAT
said probe assembly comprises
a plurality of first electrodes (221), and
a probe assembly housing (20) for resiliently mounting said first electrodes so that said electrodes extend generally perpendicular from a front surface of said housing toward said support apparatus in a row and column configuration corresponding to a connector contact terminal row and column configuration.

12. The connector testing apparatus set forth in claim 11

CHARACTERIZED IN THAT
said electrode apparatus comprises
a second electrode (230), and
insulator apparatus (231) for holding and supporting said second electrode to engage said tail section of the connector contact terminals.

13. The connector testing apparatus set forth in claim 12

CHARACTERIZED IN THAT
said guide apparatus comprises
a guide support member (40) having a head member (41) for aligning one of said first electrodes with each connector contact terminal, said head members mounted on said guide support member in said row and column configuration and each head member having an axial bore (410) sized to slidably receive said one first electrode and externally tapered to fit into a connector pin contact receiving aperture.

14. The connector testing apparatus set forth in claim 13

CHARACTERIZED IN THAT
said positioning apparatus comprises
carriage apparatus (53) for supporting said probe assembly housing,
carriage plate apparatus (54) for supporting said guide support member,
spring biased pin members (531) for attaching said carriage plate apparatus to said carriage apparatus,
support apparatus (51, 52) for slidably supporting both said carriage apparatus and said carriage plate apparatus, and
operating apparatus (55) for positioning said carriage plate apparatus and said carriage apparatus on said support apparatus to first engage said guide support head members with corresponding connector pin receiving apertures and then extend said first electrodes through said head members to engage the connector contact terminals.

15. The connector testing apparatus set forth in claim 14 in which
said measuring circuitry comprises a voltage measuring device (101) and a constant current supply (102)
CHARACTERIZED IN THAT
said coupling apparatus comprises
a controller (60) for selecting ones of said first electrodes, and
switch apparatus (61) connected to said first and second electrodes and responsive to said controller for coupling said second electrode and a controller selected first electrode engaged with a connector contact terminal to said voltage measuring device and said constant current supply.

16. Apparatus for testing connectors, said apparatus having
a constant current source (102),
a voltage measuring device (101), and
testing apparatus (1) for coupling said constant current source and said voltage measuring device to contact terminals (701) of a connector (700)
CHARACTERIZED IN THAT
said testing apparatus comprises
a plurality of first electrodes (221);
a second electrode (230);
insulator apparatus (231) for holding and supporting said second electrode;
support apparatus (3) for receiving a connector and holding the connector in a fixed relationship with respect to said insulator apparatus to engage a tail section of the connector contact terminals with said second electrode;
probe assembly apparatus (20, 21, 223) for resiliently mounting said first electrodes in a row and column configuration corresponding to a connector contact terminal row and column configuration;
guide support apparatus (4) having a plurality of head members (41) for aligning said first electrodes with the connector contact terminals, each of said head members arranged to slidably support one of said first electrodes and each externally tapered to fit into a connector pin receiving aperture;
carriage apparatus (53) for supporting said probe assembly apparatus;
carriage plate apparatus (54) for supporting said guide support apparatus;
spring biased coupling apparatus (531) for attaching said carriage plate apparatus to said carriage apparatus;
support apparatus (51, 52) for slidably supporting both said carriage apparatus and said carriage plate apparatus;
operating apparatus (55) for positioning said carriage plate apparatus and said carriage apparatus on said support apparatus to first engage said guide support apparatus head members with corresponding connector pin receiving apertures and then extend said first electrodes through said head members to engage the connector contact terminals;
controller apparatus (60) for selecting said first and second electrodes; and
switch apparatus (61, 103) connectable to said first and second electrodes and responsive to said controller apparatus for coupling a selected first and second electrode engaged with a connector contact terminal to said voltage measuring device and said constant current source to measure contamination and foreign material appearing on the engaged connector contact terminal.

17. Apparatus for testing contact terminals of a connector, said apparatus comprising
a plurality of electrodes,
means for mounting said electrodes,
means having a plurality of head members for slidably supporting first ones of said electrodes,
means for receiving and holding the connector in a fixed relationship with respect to said mounting means to engage a tail section of the connector contact terminals with a second one of said electrodes,
means for positioning said slidably supporting means and said mounting means to first align said first electrodes with pin receiving apertures of the connector and then extend said first electrodes to engage the connector contact terminals,
means for measuring electrical resistance,
means for selectively connecting said electrical resistance measuring means to said first and second electrodes to measure the resistance of contamination films and foreign material appearing on an engaged connector contact terminal.

18. A method of testing contact terminals of a connector with test apparatus comprising apparatus for mounting electrodes, support apparatus, tapered head members for slidably supporting and aligning first ones of said electrodes, positioning apparatus, and electrical resistance measuring apparatus, said method comprising the steps of
receiving and positioning a connector in said support apparatus to engage a tail section of the connector contact terminals with a second one of said electrodes,
operating said positioning apparatus to engage said tapered head members with corresponding connector pin receiving apertures and then position said mounting apparatus to extend said first electrodes through said tapered head members to engage the connector contact terminals, and
selectively coupling the electrical resistance measuring apparatus to one of said first and second electrodes engaged with a connector contact terminal to detect and measure the resistance of contamination films and foreign material appearing on the connector contact terminal.

* * * * *

UNITED STATES PATENT AND TRADEMARK OFFICE
CERTIFICATE OF CORRECTION

PATENT NO. : 4,232,262

DATED : November 4, 1980

INVENTOR(S) : George C. Emo and Thomas G. Grau

It is certified that error appears in the above-identified patent and that said Letters Patent are hereby corrected as shown below:

Assignee line, please add --Bell Telephone Laboratories, Incorporated, Murray Hill, N. J.--.

Column 2, line 6, after "apparatus", delete "as" and insert --is--.
Column 2, line 51, after "of", delete "a".
Column 3, line 35, after "testing", delete "current" and insert --contact--.
Column 5, line 30, after "rods", delete "5" and insert --52--.
Column 6, line 29, after "electrodes", delete "211" and insert --221--.
Column 8, line 48, before "902", delete "conductors" and insert --conductor--.
Column 14, line 39, after ",", insert --and--.

Signed and Sealed this

Twenty-eighth Day of April 1981

[SEAL]

Attest:

RENE D. TEGTMEYER

Attesting Officer

Acting Commissioner of Patents and Trademarks